US012782477B2

(12) United States Patent
Lu et al.

(10) Patent No.: US 12,782,477 B2
(45) Date of Patent: Nov. 3, 2026

(54) MAGNETIC RESONANCE IMAGING SYSTEM, AND RADIO-FREQUENCY SIGNAL PROCESSING METHOD AND RADIO-FREQUENCY COIL

(71) Applicant: GE Precision Healthcare LLC, Waukesha, WI (US)

(72) Inventors: Xuelian Lu, Beijing (CN); Kun Wang, Beijing (CN); Jiabin Yao, Beijing (CN); Yulong Duan, Beijing (CN)

(73) Assignee: GE Precision Healthcare LLC, Waukesha, WI (US)

( * ) Notice: Subject to any disclaimer, the term of this patent is extended or adjusted under 35 U.S.C. 154(b) by 163 days.

(21) Appl. No.: 18/882,525

(22) Filed: Sep. 11, 2024

(65) Prior Publication Data

US 2025/0093442 A1 Mar. 20, 2025

(30) Foreign Application Priority Data

Sep. 15, 2023 (CN) ......................... 202311196895.6

(51) Int. Cl.
*G01R 33/36* (2006.01)
*G01R 33/34* (2006.01)

(52) U.S. Cl.
CPC ... *G01R 33/3642* (2013.01); *G01R 33/34076* (2013.01)

(58) Field of Classification Search
None
See application file for complete search history.

(56) References Cited

U.S. PATENT DOCUMENTS

| | | | | | |
|---|---|---|---|---|---|
| 5,483,163 | A | 1/1996 | Wen | | |
| 7,733,088 | B2 | 6/2010 | Cho | | |
| 7,965,081 | B2 * | 6/2011 | Kundner | G01R 33/341 | 324/309 |
| 2003/0146750 | A1 * | 8/2003 | Vaughan, Jr. | G01R 33/34046 | 324/318 |
| 2011/0026801 | A1 * | 2/2011 | Dohata | G01R 33/3678 | 382/131 |
| 2012/0256633 | A1 * | 10/2012 | Biber | G01R 33/34084 | 324/322 |
| 2013/0093425 | A1 * | 4/2013 | Chu | G01R 33/34084 | 336/200 |
| 2018/0017643 | A1 * | 1/2018 | Zink | H03J 3/12 | |
| 2018/0372815 | A1 * | 12/2018 | Candidus | G01R 33/34084 | |
| 2020/0081082 | A1 * | 3/2020 | Kundner | G01R 33/3415 | |
| 2020/0096582 | A1 * | 3/2020 | Greiser | G01R 33/34084 | |
| 2021/0293915 | A1 * | 9/2021 | Fenchel | G01R 33/34084 | |

FOREIGN PATENT DOCUMENTS

| | | | | |
|---|---|---|---|---|
| CN | 100543490 C | | 9/2009 | |
| EP | 2734855 B1 | * | 6/2021 | G01R 33/3628 |
| JP | H10272116 A | * | 10/1998 | |

* cited by examiner

*Primary Examiner* — Rodney E Fuller

(57) ABSTRACT

A magnetic resonance imaging system, and a radio-frequency signal processing method and radio-frequency coil therefor are provided. The method comprises: receiving, via a radio-frequency coil, a radio-frequency pulse transmitted from a transceiver coil to generate a radio-frequency field that excites a subject to be examined; and sending, via the radio-frequency coil, a magnetic resonance signal received from the subject to be examined to the transceiver coil, wherein the radio-frequency coil and the transceiver coil are electromagnetically coupled.

16 Claims, 6 Drawing Sheets

MAGNETIC RESONANCE IMAGING SYSTEM, AND RADIO-FREQUENCY SIGNAL PROCESSING METHOD AND RADIO-FREQUENCY COIL

CROSS REFERENCE TO RELATED APPLICATIONS

The present application claims priority and benefit of Chinese Patent Application No. 202311196895.6 filed on Sep. 15, 2023, which is incorporated herein by reference in its entirety.

TECHNICAL FIELD

Embodiments of the present application relate to the technical field of medical devices, and relate in particular to a magnetic resonance imaging system, and a radio-frequency signal processing method and radio-frequency coil therefor.

BACKGROUND

Magnetic resonance (MR) imaging systems are widely used in the field of medical diagnosis. An existing magnetic resonance imaging system typically has a main magnet, a gradient radio-frequency amplifier, a gradient coil, a transmit chain module, a radio-frequency coil, a receive chain module, etc. The transmit chain module generates a pulse signal and transmits the same to a transmit/receive coil. The radio-frequency coil generates a radio-frequency excitation signal to excite a scanned subject to generate a magnetic resonance signal. After the excitation, the radio-frequency coil receives the magnetic resonance signal, and a medical parameter image is reconstructed according to the magnetic resonance signal.

Currently, a radio-frequency coil includes a transmit/receive coil or a receive coil, including, for example, a cavity-type body coil located within a gradient coil, and a local coil used to cover a part of a patient, such as a knee coil, a shoulder coil, a spine coil, a wrist coil, a head and neck coil, etc.

SUMMARY

Embodiments of the present application provide a magnetic resonance imaging system, and a radio-frequency signal processing method and radio-frequency coil therefor.

According to an aspect of the embodiments of the present application, there is provided a radio-frequency signal processing method for a magnetic resonance imaging system, the method comprising: receiving, via a radio-frequency coil, a radio-frequency pulse transmitted from a transceiver coil to generate a radio-frequency field that excites a subject to be examined; and sending, via the radio-frequency coil, a magnetic resonance signal received from the subject to be examined to the transceiver coil, wherein the radio-frequency coil and the transceiver coil are electromagnetically coupled.

According to an aspect of the embodiments of the present application, there is provided a radio-frequency coil for a magnetic resonance imaging system. The radio-frequency coil receives a radio-frequency pulse transmitted from a transceiver coil in the magnetic resonance imaging system to generate a radio-frequency field that excites a subject to be examined. The radio-frequency coil sends a magnetic resonance signal received from the subject to be examined to the transceiver coil. The radio-frequency coil and the transceiver coil are electromagnetically coupled.

According to an aspect of the embodiments of the present application, there is provided a magnetic resonance imaging system, the system comprising: a transceiver coil, and the radio-frequency coil of the previous aspect.

With reference to the following description and drawings, specific embodiments of the examples of the present application are disclosed in detail, and the means by which the principles of the examples of the present application can be employed are illustrated. It should be understood that the embodiments of the present application are therefore not limited in scope. Within the scope of the spirit and clauses of the appended claims, the embodiments of the present application include many changes, modifications, and equivalents.

BRIEF DESCRIPTION OF THE DRAWINGS

The included drawings are used to provide further understanding of the examples of the present application, which constitute a part of the description and are used to illustrate the embodiments of the present application and explain the principles of the present application together with textual description. Evidently, the drawings in the following description are merely some examples of the present application, and a person of ordinary skill in the art may obtain other embodiments according to the drawings without involving inventive skill. In the drawings.

DETAILED DESCRIPTION

The foregoing and other features of the examples of the present application will become apparent from the following description and with reference to the drawings. In the description and drawings, specific embodiments of the present application are disclosed in detail, and part of the embodiments in which the principles of the examples of the present application may be employed are indicated. It should be understood that the present application is not limited to the described embodiments. On the contrary, the examples of the present application include all modifications, variations, and equivalents which fall within the scope of the appended claims.

In the examples of the present application, the terms “first” and “second” and so on are used to distinguish different elements from one another by their title, but do not represent the spatial arrangement, temporal order, or the like of the elements, and the elements should not be limited by said terms. The term “and/or” includes any one of and all combinations of one or more associated listed terms. The terms “comprise”, “include”, “have”, etc., refer to the presence of stated features, elements, components, or assemblies, but do not exclude the presence or addition of one or more other features, elements, components, or assemblies.

In the examples of the present application, the singular forms “a” and “the” or the like include plural forms, and should be broadly construed as “a type of” or “a kind of” rather than being limited to the meaning of “one”. Furthermore, the term “the” should be construed as including both the singular and plural forms, unless otherwise specified in the context. In addition, the term “according to” should be construed as “at least in part according to . . . ”, and the term “based on” should be construed as “at least in part based on . . . ”, unless otherwise clearly specified in the context.

The features described and/or illustrated for one embodiment may be used in one or more other embodiments in an identical or similar manner, combined with features in other embodiments, or replace features in other embodiments. The term “include/comprise” when used herein refers to the presence of features, integrated components, steps, or assemblies, but does not exclude the presence or addition of one or more other features, integrated components, steps, or assemblies.

Figure 1:
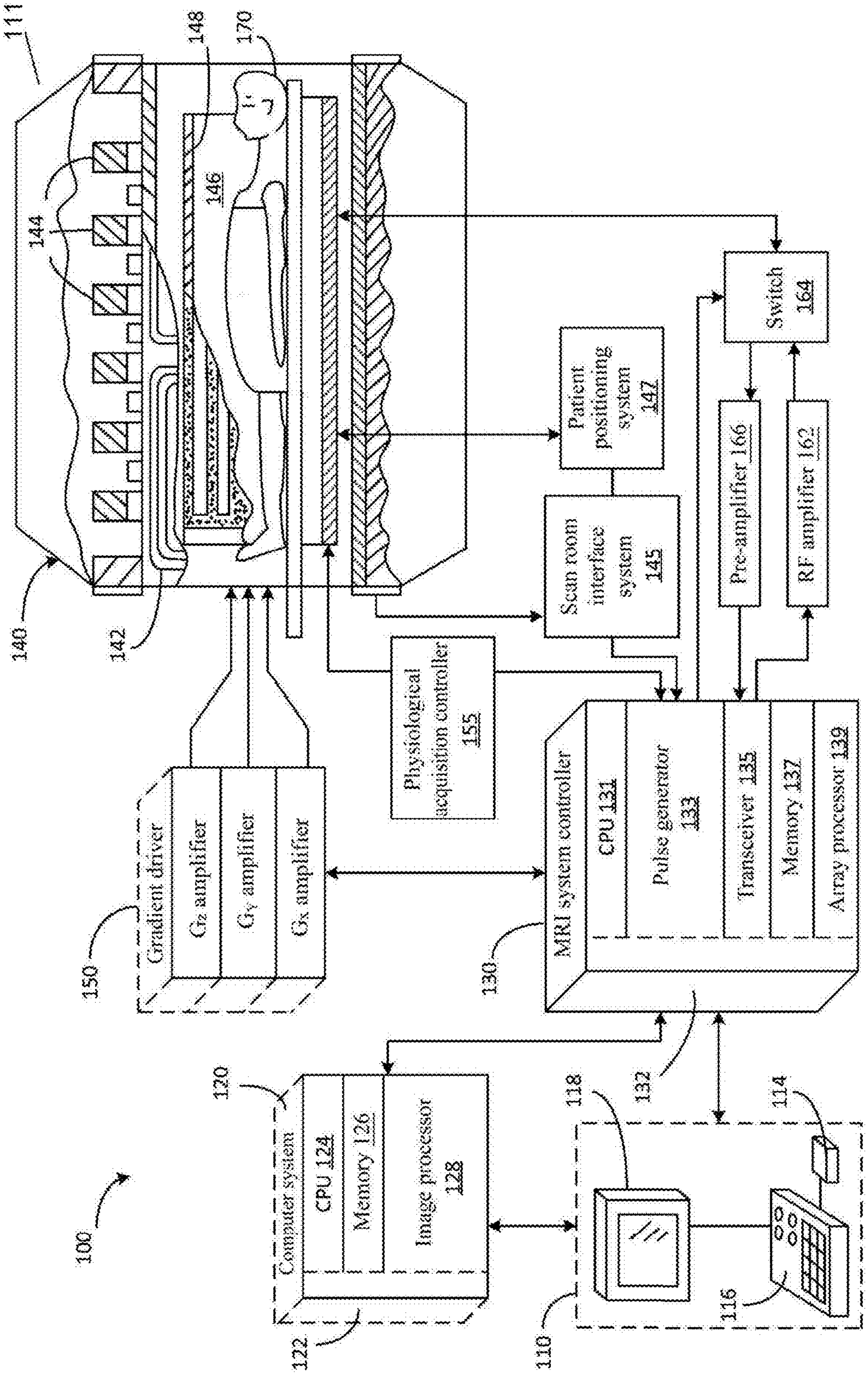
FIG. 1 is a schematic diagram of a magnetic resonance imaging system according to an embodiment of the present application.

For ease of understanding, FIG. 1 shows a magnetic resonance imaging (MRI) system 100 according to some examples of the present invention.

The MRI system 100 includes a scanning unit 111. The scanning unit 111 is used to perform a magnetic resonance scan on a subject (for example, a human body) 170 to generate image data of a region of interest of the subject 170. The region of interest may be a predetermined anatomical site or anatomical tissue.

Operation of the MRI system 100 is controlled by an operator workstation 110, and the operator workstation 110 includes an input device 114, a control panel 116, and a display 118. The input device 114 may be a joystick, a keyboard, a mouse, a trackball, a touch-activated screen, voice control, or any similar or equivalent input device. The control panel 116 may include a keyboard, a touch-activated screen, voice control, a button, a slider, or any similar or equivalent control device. The operator workstation 110 is coupled to and communicates with a computer system 120, and the computer system enables an operator to control the generation and viewing of an image on the display 118. The computer system 120 includes a plurality of components that communicate with one another by means of an electrical and/or data connection module 122. The connection module 122 may employ a direct wired connection, a fiber optic connection, a wireless communication link, etc. The computer system 120 may include a central processing unit (CPU) 124, a memory 126, and an image processor 128. In some embodiments, the image processor 128 may be replaced with an image processing function implemented in the CPU 124. The computer system 120 may be connected to an archival media device, a persistent or backup memory, or a network. The computer system 120 may be coupled to and communicate with a separate MRI system controller 130.

The MRI system controller 130 includes a set of components that communicate with one another by means of an electrical and/or data connection module 132. The connection module 132 may employ a direct wired connection, a fiber optic connection, a wireless communication link, etc. The MRI system controller 130 may include a CPU 131, a sequential pulse generator 133 that communicates with the operator workstation 110, a transceiver (or an RF transceiver) 135, a memory 137, and an array processor 139. In some embodiments, the sequential pulse generator 133 may be integrated into a resonance assembly 140 of the scanning unit 111 of the MRI system 100. The MRI system controller 130 may receive a command from the operator workstation 110, and is coupled to the scanning unit 111, to indicate an MRI scan sequence that is to be performed during an MRI scan, so as to control the scanning unit 111 to execute the described magnetic resonance scan procedure. The MRI system controller 130 is further coupled to and communicates with a gradient driver system 150, and the gradient driver system is coupled to a gradient coil assembly 142 to generate a magnetic field gradient during the MRI scan.

The sequential pulse generator 133 may further receive data from a physiological acquisition controller 155, the physiological acquisition controller receives signals from a plurality of different sensors (for example, electrocardiogram (ECG) signals from electrodes attached to a patient), the sensors being connected to the subject or patient 170 undergoing the MRI scan. The sequential pulse generator 133 is coupled to and communicates with a scan room interface system 145, and the scan room interface system receives signals from various sensors associated with the state of the resonance assembly 140. The scan room interface system 145 is further coupled to and communicates with a patient positioning system 147, and the patient positioning system sends and receives signals to control the movement of a patient table to a desired position to perform the MRI scan.

The MRI system controller 130 provides a gradient waveform for the gradient driver system 150, the gradient driver system including $G_X$ (x direction), $G_y$ (y direction), and $G_z$ (z direction) amplifiers, etc. Each of the $G_X$, $G_y$, and $G_z$ gradient amplifiers excites a corresponding gradient coil in the gradient coil assembly 142, to generate a magnetic field gradient used to spatially encode an MR signal during the MRI scan. The gradient coil assembly 142 is disposed within the resonance assembly 140, the resonance assembly further includes a superconducting magnet having a superconducting coil 144, and during operation, the superconducting coil provides a static uniform longitudinal magnetic field $B_0$ that runs through a cylindrical imaging volume 146. The resonance assembly 140 further includes an RF body coil 148; during operation, the RF body coil provides a transverse magnetic field $B_1$, the transverse magnetic field $B_1$ being substantially perpendicular to $B_0$ throughout the cylindrical imaging volume 146. The RF body coil 148 may also be referred to as a transceiver coil hereinafter, that is, transmit and receive coils integrated together, which can either transmit or receive a radio-frequency pulse, but not both at the same time. That is, the RF body coil 148 may be configured by a transmit/receive switch (T/R switch) 164 to operate in a transmit and receive mode, a transmit mode, or a receive mode.

The x direction may also be referred to as a frequency encoding direction or a kx direction in a k-space. The y direction may be referred to as a phase encoding direction or a ky direction in the k-space. $G_X$ may be used for frequency encoding or signal readout, and is typically referred to as a frequency encoding gradient or a readout gradient. $G_y$ may be used for phase encoding, and is typically referred to as a phase encoding gradient. $G_z$ may be used for slice (layer) position selection to obtain k-space data. It should be noted that a layer selection direction, a phase encoding direction, and a frequency encoding direction may be modified according to actual requirements.

The subject or patient 170 of the MRI scan may be positioned within the cylindrical imaging volume 146 of the resonance assembly 140. The transceiver 135 in the MRI system controller 130 generates RF excitation pulses that are amplified by an RF amplifier 162 and provided to the RF body coil 148 by means of the transmit/receive switch (T/R switch) 164.

As described above, the RF body coil 148 may be used to transmit an RF excitation pulse and/or receive resulting MR signals from the patient undergoing the MRI scan. MR signals emitted by excited nuclei in the body of the patient of the MRI scan may be sensed and received by the RF body coil 148 and sent back to a pre-amplifier 166 by means of the T/R switch 164. The T/R switch 164 may be controlled by a signal from the sequential pulse generator 133 to electrically connect, when in the transmit mode, the RF amplifier 162 to the RF body coil 148, and to connect, when in the receive mode, the pre-amplifier 166 to the RF body coil 148.

In some embodiments, the MR signals sensed and received by the RF body coil 148 and amplified by the pre-amplifier 166 are stored as a raw k-space data array in the memory 137 for post-processing. A reconstructed magnetic resonance image may be obtained by transforming/processing the stored raw k-space data.

In some embodiments, the MR signals sensed and received by the RF body coil 148 and amplified by the pre-amplifier 166 are demodulated, filtered, and digitized in a receiving portion of the transceiver 135, and transmitted to the memory 137 in the MRI system controller 130. For each image that is to be reconstructed, the data is rearranged into a separate k-space data array, each of the separate k-space data arrays is inputted into the array processor 139, and the array processor is operated to transform the data into an array of image data by means of a Fourier transform.

The array processor 139 uses a transform method, most commonly a Fourier transform, to reconstruct images from the received MR signals. These images are transmitted to the computer system 120 and stored in the memory 126. In response to commands received from the operator workstation 110, the image data may be stored in a long-term memory, or may be further processed by the image processor 128 and transmitted to the operator workstation 110 for presentation on the display 118.

In various embodiments, components of the computer system 120 and the MRI system controller 130 may be implemented on the same computer system or on a plurality of computer systems. It should be understood that the MRI system 100 shown in FIG. 1 is intended for illustration. Suitable MRI systems may include more, fewer, and/or different components.

The MRI system controller 130 and the image processor 128 may separately or collectively include a computer processor and a storage medium. The storage medium records a predetermined data processing program that is to be executed by the computer processor. For example, the storage medium may store a program used to implement scanning (for example, a scan procedure and an imaging sequence), image reconstruction, image processing, etc. For example, the storage medium may store a program used to implement the magnetic resonance imaging method according to the examples of the present invention. The above storage medium may include, for example, a ROM, a floppy disk, a hard disk, an optical disk, a magneto-optical disk, a CD-ROM, or a non-volatile memory card.

The aforementioned "imaging sequence" (also referred to below as a scan sequence or a pulse sequence) is a combination of pulses that have specific amplitudes, widths, directions, and time sequences, and that are applied when a magnetic resonance imaging scan is performed. These pulses typically may include, for example, radio-frequency pulses and gradient pulses. The radio-frequency pulses may include, for example, radio-frequency excitation pulses, radio-frequency refocusing pulses, inverse recovery pulses, etc. The gradient pulses may include, for example, the aforementioned gradient pulse used for layer selection, gradient pulse used for phase encoding, gradient pulse used for frequency encoding, gradient pulse used for phase shifting (phase shift), gradient pulse used for dispersion of phases (dephasing), etc. Typically, a plurality of scan sequences can be preset in the magnetic resonance system, so that a sequence suitable for clinical examination requirements can be selected. The clinical examination requirements may include, for example, an imaging site, an imaging function, an imaging effect, and the like.

As mentioned previously, the RF body coil 148 in the magnetic resonance imaging system may be used to transmit/receive radio-frequency signals, but in actual scanning, an additional magnetic resonance-specific local coil (e.g., as the receive coil), such as a knee coil, a shoulder coil, a spine coil, a wrist coil, and a head and neck coil, may still be used to scan a specific site. The local coil is typically positioned close to the patient and thus provides a higher signal-to-noise ratio (SNR).

At present, a coil array structure composed of a plurality of coil elements is used for a common local coil. Each local coil needs to be equipped with its own corresponding cable and receive channel for transmission of magnetic resonance signals. The local coil has a cable interface for connecting one end of the cable. The other end of the cable is connected to a cable interface disposed on an examination table. A magnetic resonance signal received from the local coil is transmitted to a receive chain module of the local coil through the cable, amplified by a radio-frequency pre-amplifier, then demodulated, filtered, analog-to-digital converted, pre-processed, Fourier transformed, and so on, and finally reconstructed into a magnetic resonance image.

The coil array structure typically includes a decoupling circuit. In some embodiments, the decoupling circuit may be used for electromagnetic decoupling between the receive coil and the radio-frequency transmit coil during radio-frequency transmission to avoid affecting a transmit field.

The inventors have also found that a decoupling circuit included in the coil array structure requires DC power to operate, so the coil array also needs to rely on cables for DC power supply, but this increases the difficulty of wiring. In addition, to improve image quality, the number of receive channels becomes higher and higher. For example, the number of receive channels is 16 or 32 or 64 or the like, which undoubtedly further increases the complexity of the cable interface and the cables and increases costs.

In view of at least one of the above technical problems, the embodiments of the present application provide a magnetic resonance imaging system, and a radio-frequency signal processing method and radio-frequency coil therefor. The embodiments of the present application are specifically described below.

The embodiments of the present application provide a radio-frequency coil for a magnetic resonance imaging system. The radio-frequency coil receives a radio-frequency pulse transmitted from a transceiver coil in the magnetic resonance imaging system to generate a radio-frequency field that excites a subject to be examined. The radio-frequency coil sends a magnetic resonance signal received from the subject to be examined to the transceiver coil. The radio-frequency coil and the transceiver coil are electromagnetically coupled.

In some embodiments, the transceiver coil may be a body coil, such as the RF body coil 148 in FIG. 1. A transmit chain module of the magnetic resonance system generates a digital pulse waveform according to a selected scanning sequence, and the digital pulse waveform is converted into an analog signal, which is amplified by a radio-frequency amplifier and transmitted to the transceiver coil via a transmission cable, and drives the transceiver coil (which is, for example, configured into a transmit mode by a T/R switch) to transmit a radio-frequency pulse. The transceiver coil may be a coil having a birdcage-like structure, but the embodiments of the present application are not limited thereto. Reference may be made to the related art for the implementation of the transceiver coil, which will not be described in detail here.

Figure 2:
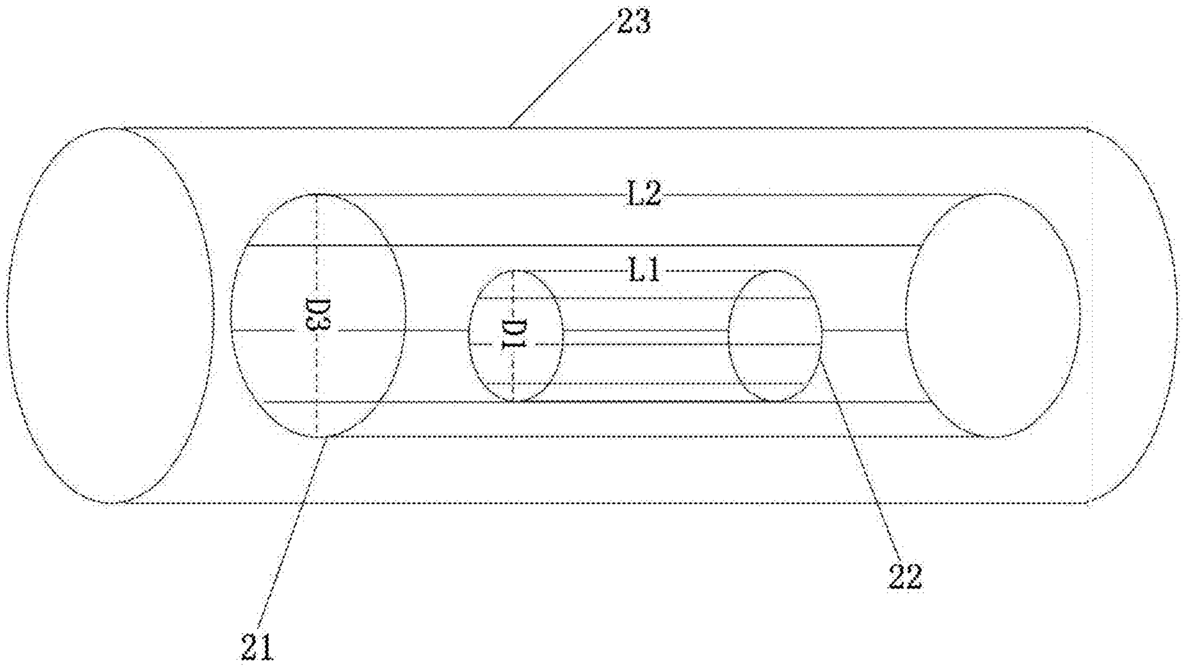
FIG. 2 is a schematic diagram of a transceiver coil and a radio-frequency coil according to an embodiment of the present application.

In some embodiments, the radio-frequency coil is an independent local coil, including at least one of a head coil, a knee coil, an ankle joint coil, an abdomen coil, an elbow coil, a chest coil, a spine coil, a neck coil, and a shoulder coil, but the embodiments of the present application are not limited thereto. During scanning, the radio-frequency coil is disposed in a scanning space defined by the transceiver coil. The radio-frequency coil is sleeved on a site to be imaged of the subject to be examined. That is, the radio-frequency coil is located between the transceiver coil and the subject to be examined. In other words, the radio-frequency coil is closer to the subject to be examined than the transceiver coil is, and the radio-frequency coil and the transceiver coil have the same or approximately the same electromagnetic structure. FIG. 2 is a schematic structural diagram of a transceiver coil and a radio-frequency coil according to an embodiment of the present application. As shown in FIG. 2, a layer of radio-frequency shielding 23 is introduced between the transceiver coil 21 and a gradient coil (not shown). When the transceiver coil 21 has a birdcage-like structure, the radio-frequency coil 22 also has a birdcage-like structure. During scanning, the radio-frequency coil 22 is located within the transceiver coil 21 and is disposed on the site to be imaged of the subject to be examined. The volume of the radio-frequency coil is smaller than the volume of the transceiver coil. For example, the length L1 of the radio-frequency coil is smaller than the length L2 of the transceiver coil, and the diameter D1 of the radio-frequency coil is smaller than the diameter D2 of the transceiver coil. However, the values of the length L1 and the diameter D1 of the radio-frequency coil are related to the site to be imaged. The embodiments of the present application are not limited thereto. That both the transceiver coil and the radio-frequency coil have a birdcage-like structure has been taken for example above, but the embodiments of the present application are not limited thereto.

In some embodiments, by means of the electromagnetic coupling between the transceiver coil and the radio-frequency coil, the radio-frequency coil receives the radio-frequency pulse from the transceiver coil and sends the magnetic resonance signal to the transceiver coil. That is, the radio-frequency pulse transmitted by the transceiver coil is transferred to the radio-frequency coil by means of the electromagnetic coupling, and the magnetic resonance signal received by the radio-frequency coil is transferred to the transceiver coil by means of the electromagnetic coupling. The operation principle of the radio-frequency coil will be described below.

In some embodiments of the present application, the radio-frequency coil and the transceiver coil have the same electromagnetic structure. By using the principles of electromagnetism, during scanning, the radio-frequency coil is close to the transceiver coil, and the radio-frequency coil and the transceiver coil generate electromagnetic coupling, which is strong. Therefore, when the transceiver coil transmits a radio-frequency pulse, a current may be induced in the radio-frequency coil, that is, the radio-frequency pulse may be transferred from the transceiver coil to the radio-frequency coil by using the induced magnetic field. The radio-frequency pulse transferred to the radio-frequency coil generates a uniform magnetic field B1 that excites the subject to be examined, and excites the subject to be examined to generate resonance, so as to generate a transverse magnetization vector. After the transmission of the radio-frequency pulse is completed (after the magnetic field B1 is removed), the transverse magnetization vector attenuates in a spiral shape until it returns to zero. A free induction attenuation signal is generated in the process of attenuation. The free induction attenuation signal can be sensed and received by the radio-frequency coil as a magnetic resonance signal. Similarly, when the radio-frequency coil receives the magnetic resonance signal, a current may be induced in the transceiver coil, that is, the magnetic resonance signal may be transferred from the radio-frequency coil to the transceiver coil by using the induced magnetic field, and is transmitted to a receive chain module of the system via a transmission cable connected to the transceiver coil, and reconstructed into a magnetic resonance image after processing.

In some embodiments, the electromagnetic coupling (mutual inductance) is generated between the transceiver coil and the radio-frequency coil in a wireless non-contact manner to transmit and receive radio-frequency signals. Unlike the coil array structures of existing local coils, which need to be equipped with their own corresponding cables and receive channels for the transmission of magnetic resonance signals, the radio-frequency coil does not need to be electrically connected to other structures in the magnetic resonance imaging system. In other words, the radio-frequency coil is independent and may transmit and receive radio-frequency signals on its own without being provided with a cable interface or connected to an examination table via a cable. Therefore, the magnetic resonance image can be reconstructed using only the receive link of the system connected to the transceiver coil without needing to provide DC power for switching the transmit/receive modes, provide the decoupling circuit in conventional coil array structures, or provide an additional receive chain module (for example, a receive chain module corresponding to the conventional coil array). That is, radio-frequency signals are transmitted and received by means of the electromagnetic coupling between the transceiver coil and the radio-frequency coil in the absence of a cable and a cable interface. Thus, the wiring problem of the magnetic resonance system can be simplified, simplifying the circuit structure, improving reliability, reducing the failure rate, and reducing costs.

In addition, when the transceiver coil transmits radio-frequency pulses, due to the smaller volume of the radio-frequency coil, the coupled energy is less. Compared with the transceiver coil directly transmitting radio-frequency pulses to generate the field B1, the radio-frequency coil can excite the subject to be examined to generate the same field B1 using less energy, thereby achieving a lower specific absorption rate (SAR) and saving more energy.

In addition, when the subject to be examined is located in a scan cavity, the transceiver coil is far away from the site to be imaged, and cannot generate a strong magnetic field near the center of the site to be imaged. By transmitting and receiving radio-frequency signals using a small-volume radio-frequency coil that is closer to the site to be imaged and similar in size to the site to be imaged, the subject to be examined can be excited to generate the same field B1 using less energy, so that the signal-to-noise ratio can be further improved.

In addition, the same electromagnetic structure as that of the transceiver coil is used for the radio-frequency coil, for example, a birdcage-like coil structure, that can cause the generated magnetic field to be more uniform compared with the conventional coil array structure, further improving the signal-to-noise ratio.

The mechanical structure (a birdcage-like structure is used as an example) of the radio-frequency coil will be described in detail below with reference to the accompanying drawings.

Figure 3:
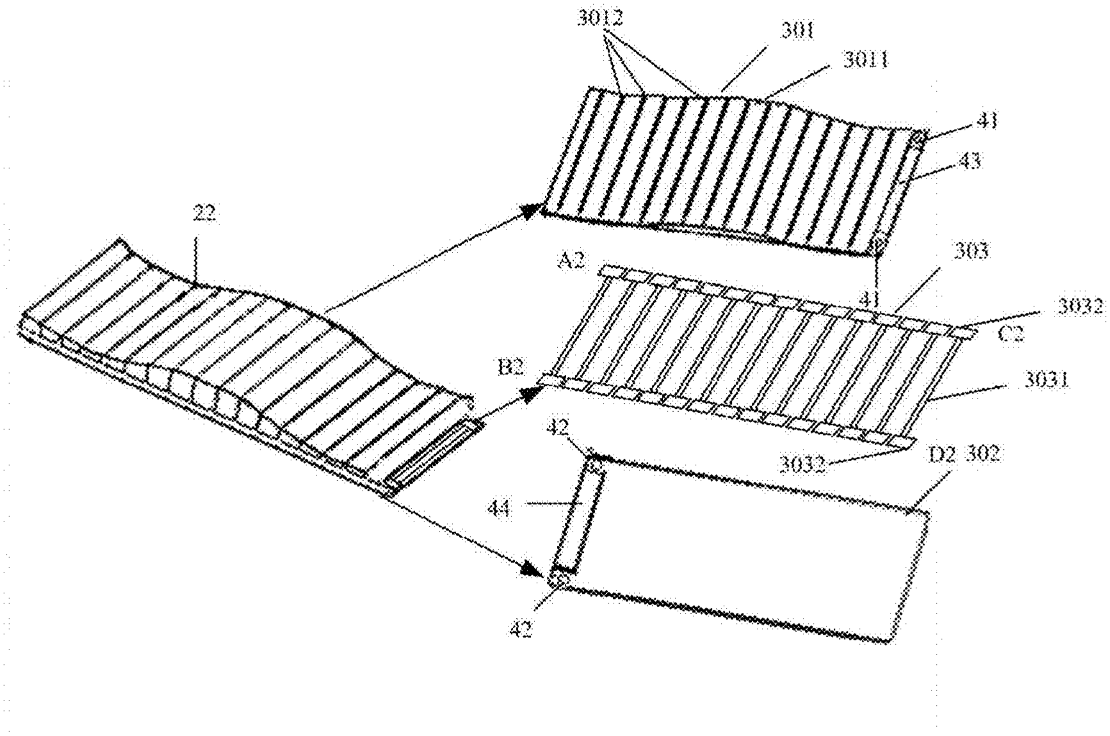
FIG. 3 is a schematic diagram of a radio-frequency coil in an open state according to an embodiment of the present application.
Figure 4:
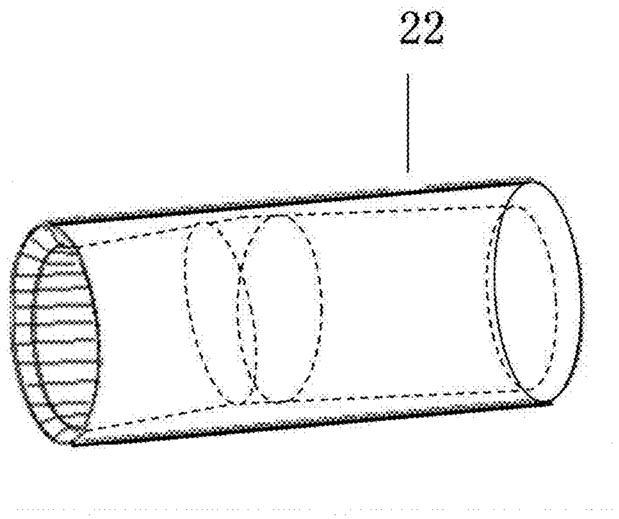
FIG. 4 is a schematic diagram of a radio-frequency coil in a closed state according to an embodiment of the present application.

In some embodiments, to improve the comfort of the subject to be examined and improve the ease of wearing the radio-frequency coil, the radio-frequency coil may be designed as a flexible deformable coil. That is, the radio-frequency coil includes a closed state and an open state. FIG. 3 is a schematic diagram of a radio-frequency coil in an open state according to an embodiment of the present application, and FIG. 4 is a schematic diagram of a radio-frequency coil in a closed state according to an embodiment of the present application. As shown in FIG. 4, in the closed state, the radio-frequency coil has a cylindrical shape (is birdcage-like). As shown in FIG. 3, in the open state, the radio-frequency coil is capable of being unfolded into a rectangular sheet-like structure. When the subject to be examined needs to be scanned, the radio-frequency coil is opened, so that the site to be imaged of the subject to be examined is placed on the rectangular sheet-like structure of the radio-frequency coil, and then the radio-frequency coil is closed so as to enter the center of the scan cavity together with the subject to be examined.

In some embodiments, as shown in FIG. 3, the radio-frequency coil 22 includes a three-layer structure, namely, a first mechanical layer 301, a second mechanical layer 302, and an electrical layer 303 that forms the birdcage-like structure. The electrical layer 303 is arranged between the first mechanical layer 301 and the second mechanical layer 302.

In some embodiments, the electrical layer 303 is a coil layer. In the closed state, the electrical layer is configured as a birdcage-like structure. The birdcage-like structure includes a plurality of rungs 3031 arranged in parallel and two endrings 3032 at two ends of each of the rungs. The two ends of each rung are connected to corresponding endrings, respectively. That is, one end of each rung is connected to one endring, and the other end is connected to the other endring. The number of rungs 3031 may be determined as needed, and the embodiments of the present application are not limited thereto. Reference may be made to the related art for the structures and materials of the rungs and endrings, which will not be described here again. In the open state, the two endrings 3032 include end portions A2, B2, C2 and D2.

In some embodiments, by means of lamination molding, the first mechanical layer 301 and the second mechanical layer 302 are fixedly connected to the electrical layer 302 by means of heating or pressurization, and the electrical layer 302 is enclosed between the first mechanical layer 301 and the second mechanical layer 302. The first mechanical layer and the second mechanical layer may be made of a flexible insulating material (which may also be, but is not limited to being, cleansing, waterproof, flame retardant, or lightweight), such as one or a plurality of elastomeric materials, polyester materials, cotton, wool, and foam, but the embodiments of the present application are not limited thereto. In the closed state, the radio-frequency coil is in a cylindrical shape, the first mechanical layer 301 may also be referred to as an inner layer of the radio-frequency coil, and the second mechanical layer 302 may also be referred to as an outer layer of the radio-frequency coil. In the open state, a first connecting portion 41 is disposed on the first mechanical layer on one side of the rectangular sheet-like structure, and a second connecting portion 42 is disposed on the second mechanical layer on the other side of the rectangular sheet-like structure. The first connecting portion and the second connecting portion are connected and fixed or matched with each other, so that the radio-frequency coil is changed from the rectangular sheet-like structure to a closed birdcage-like structure. Thus, it is convenient for the subject to be examined to wear the radio-frequency coil.

For example, the first connecting portion and the second connecting portion are respectively disposed on two edges of the rectangular sheet-like structure parallel to the length direction of the rungs. The first connecting portion and the second connecting portion may be disposed at endpoint positions of the two edges, such as the positions of the end portions A2, B2, C2 and D2. The first connecting portion is disposed on the first mechanical layer, that is, the first connecting portion is disposed on the inner surface of the inner layer of the radio-frequency coil. The second connecting portion is disposed on the second mechanical layer, that is, the second connecting portion is disposed on the outer surface of the outer layer of the radio-frequency coil. The rectangular sheet-like structure is bent into a cylindrical shape, so that the first connecting portion and the second connecting portion on two sides of the rectangular sheet-like structure are connected and fixed.

In some embodiments, since the birdcage-like coil needs electrical connection at the end portions A2, B2, C2, and D2 of the endrings, the first connecting portion and the second connecting portion may be disposed to be electrically connected to the electrical layer. In other words, when designing the first connecting portion and the second connecting portion on the first mechanical layer and the second mechanical layer, the first connecting portion and the second connecting portion need to penetrate the first mechanical layer and the second mechanical layer to communicate with the electrical layer. For example, the first connecting portion and the second connecting portion need to contact the two endrings of the electrical layer (for example, at the four positions of the end portions A2, B2, C2 and D2). In addition, the first connecting portion and the second connecting portion are made of an electrically-conductive material to achieve electrical connection.

Figure 5:
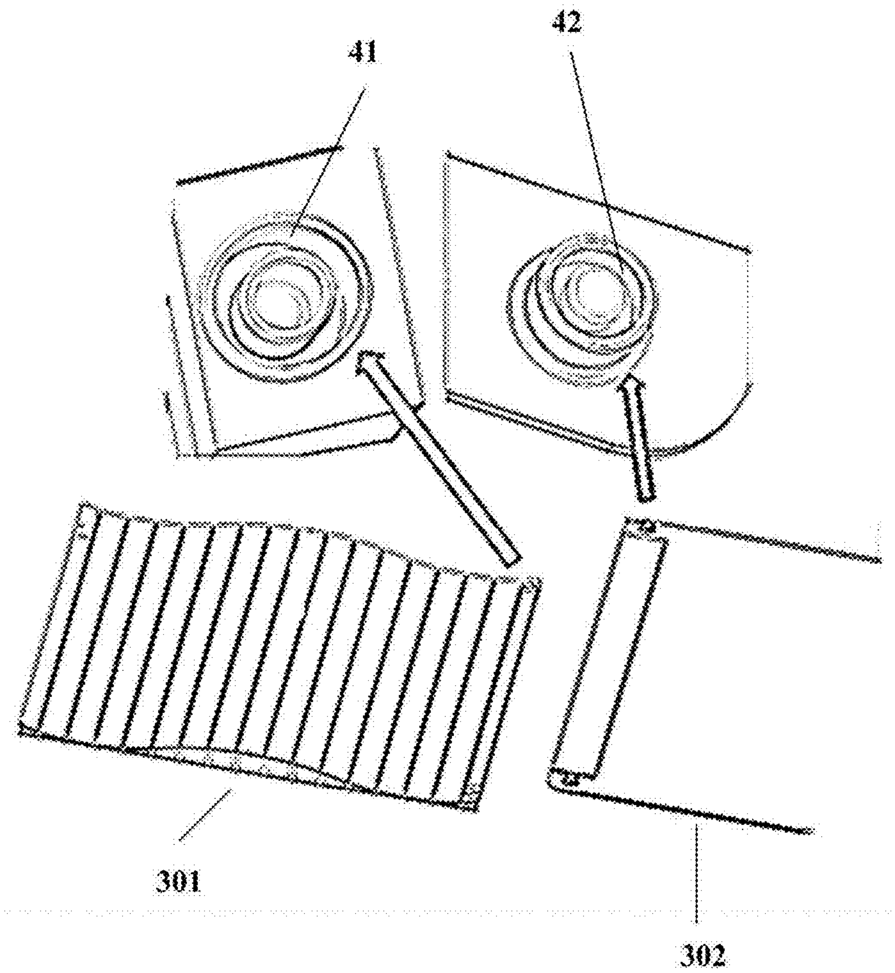
FIG. 5 is a schematic diagram of a first connecting portion and a second connecting portion according to an embodiment of the present application.

In some embodiments, the first connecting portion and the second connecting portion may be a male part and a female part of a metal snap, respectively. FIG. 5 is a schematic diagram of a first connecting portion and a second connecting portion according to an embodiment of the present application. As shown in FIG. 5, the radio-frequency coil is changed into a closed state by the fixed connection of the metal snap.

In some embodiments, to further ensure the degree of closure of the radio-frequency coil, a third connecting portion 43 is further disposed on the first mechanical layer on one side of the rectangular sheet-like structure, a fourth connecting portion 44 is further disposed on the second mechanical layer on the other side of the rectangular sheet-like structure, and the third connecting portion and the fourth connecting portion are connected and fixed, so that the radio-frequency coil is changed from the rectangular sheet-like structure to a closed birdcage-like structure.

For example, the third connecting portion may be disposed in the middle of two first connecting portions on the one side, and the fourth connecting portion may be disposed in the middle of two second connecting portions on the other side. The third connecting portion is disposed on the first mechanical layer, that is, the third connecting portion is disposed on the inner surface of the inner layer of the radio-frequency coil. The fourth connecting portion is disposed on the second mechanical layer, that is, the fourth connecting portion is disposed on the outer surface of the outer layer of the radio-frequency coil. The rectangular sheet-like structure is bent into a cylindrical shape, so that the third connecting portion and the fourth connecting portion on two sides of the rectangular sheet-like structure are connected and fixed. The third connecting portion and the fourth connecting portion do not need to be electrically connected to the electrical layer, and may be made of an insulating material.

For example, the third connecting portion and the fourth connecting portion are in the shape of an elongated strip, or are only disposed at a predetermined number of positions in the middle of the two first connecting portions and in the middle of the two second connecting portions. For example, as shown in FIG. 3, the third connecting portion and the fourth connecting portion may be hook and loop fasteners (such as Velcro) in the shape of an elongated strip, or respectively male parts and female parts of a predetermined number of (insulated) snaps, etc., and the embodiments of the present application are not limited thereto.

In some embodiments, the second mechanical layer is flat. However, to satisfy ergonomic design, the shape of the first mechanical layer of the radio-frequency coil (the inner layer in contact with the subject to be examined) may be designed to be as consistent as possible with the shape of the site to be imaged, so as to meet the comfort requirements of the subject to be examined and further improve the signal-to-noise ratio. For example, a curved arc-shaped protrusion 3011 is disposed on a surface of the first mechanical layer. The arc-shaped protrusion may be disposed at a middle position of the rectangular sheet-like structure. When the radio-frequency coil is a knee coil, the arc-shaped protrusion is used to provide support for physiological bending of a knee joint. During scanning, the back of the knee may be placed on the arc-shaped protrusion, and the two sides of the rectangular sheet-like structure may then be bent so that the above-mentioned connecting portions are separately connected and fixed, thus improving the convenience for operators. However, the embodiments of the present application are not limited thereto. For example, the two sides of the rectangular sheet-like structure may first be bent so that the above-mentioned connecting portions are separately connected and fixed, and the radio-frequency coil may then be sleeved on the site to be imaged.

In some embodiments, since the first mechanical layer has a certain thickness, there will be wrinkles in the closed state. Therefore, at least one groove 3012 may further be disposed on the surface of the first mechanical layer. The extension direction of the at least one groove 3012 is parallel to the length direction of the rungs, the length of the at least one groove is approximately the same as the width of the first mechanical layer, and the depth of the at least one groove is less than or equal to the thickness of the first mechanical layer. By means of the at least one groove, the radio-frequency coil is more easily bent, and the inner layer is wrinkle-free in the closed state, improving the comfort of the subject to be examined.

The above embodiments merely provide illustrative descriptions of the embodiments of the present application. However, the present application is not limited thereto, and appropriate variations may be made on the basis of the above embodiments. For example, each of the above embodiments may be used independently, or one or more among the above embodiments may be combined.

The embodiments of the present application provide a radio-frequency signal processing method for a magnetic resonance imaging system. The same content as that of the foregoing embodiments will not be described again.

Figure 6:
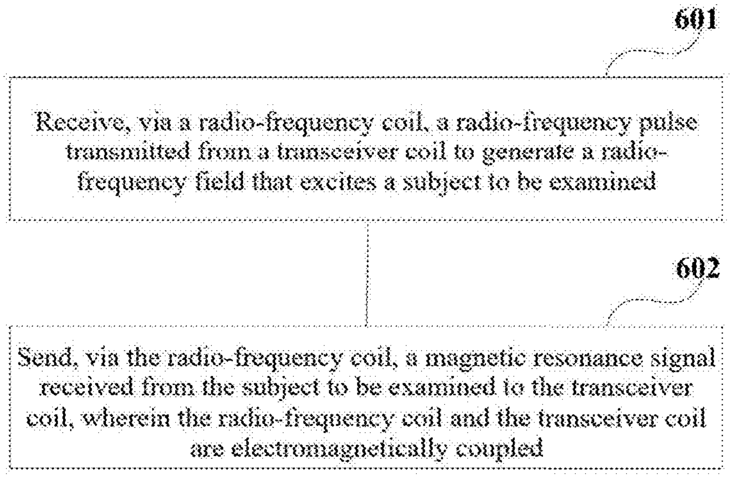
FIG. 6 is a schematic diagram of a radio-frequency signal processing method according to an embodiment of the present application.

FIG. 6 is a schematic diagram of a radio-frequency signal processing method according to an embodiment of the present application. As shown in FIG. 6, the method includes: at step 601, receiving, via a radio-frequency coil, a radio-frequency pulse transmitted from a transceiver coil to generate a radio-frequency field that excites a subject to be examined. The method also includes at step 602, sending, via the radio-frequency coil, a magnetic resonance signal received from the subject to be examined to the transceiver coil, wherein the radio-frequency coil and the transceiver coil are electromagnetically coupled.

In some embodiments, during scanning, the radio-frequency coil is opened, so that the site to be imaged of the subject to be examined is placed on the sheet-like structure of the radio-frequency coil. Then, the foregoing connecting portions are connected and fixed, so that the radio-frequency coil is closed and enters the center of the scan cavity together with the subject to be examined. Alternatively, the two sides of the rectangular sheet-like structure may first be bent so that the connecting portions are separately connected and fixed, and the radio-frequency coil may then be sleeved on the site to be imaged to enter the center of the scan cavity along with the subject to be examined.

Figure 7:
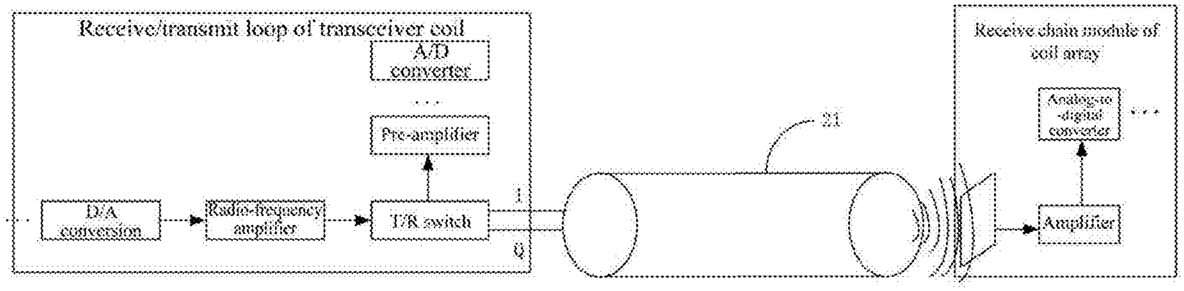
FIG. 7 is a schematic flow diagram of conventional radio-frequency signal processing.
Figure 8:
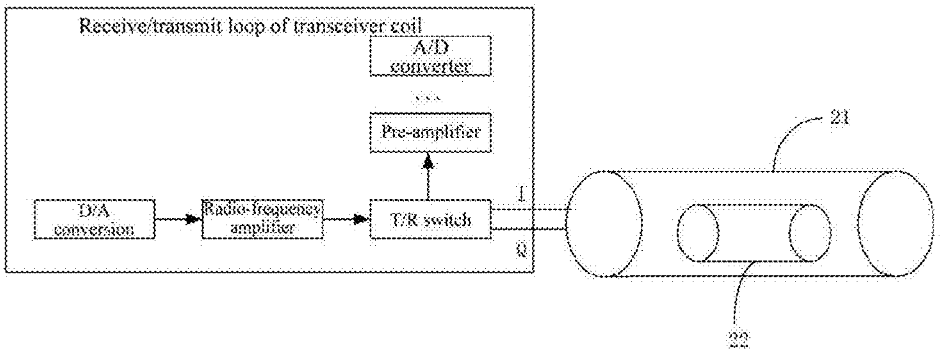
FIG. 8 is a schematic flow diagram of radio-frequency signal processing according to an embodiment of the present application.

FIG. 7 is a schematic flow diagram of conventional local coil radio-frequency signal processing, and FIG. 8 is a schematic flow diagram of radio-frequency signal processing according to an embodiment of the present application. As shown in FIG. 7, after a scanning protocol is set, a transmit link of a magnetic resonance system generates a digital pulse waveform according to a selected scanning sequence, and the digital pulse waveform is converted into an analog signal by a digital-to-analog (D/A) converter. The analog signal is amplified by a radio-frequency power amplifier and transmitted to a transceiver coil via a transmission cable, and drives the transceiver coil (which is, for example, configured into a transmit mode by a T/R switch, and orthogonally fed power by means of I and Q paths) to transmit a radio-frequency pulse. A uniform magnetic field B1 that excites a subject to be examined is generated to excite the subject to be examined to generate resonance, so as to generate a transverse magnetization vector. After the transmission of the radio-frequency pulse is completed (after the magnetic field B1 is removed), the transverse magnetization vector attenuates in a spiral shape until it returns to zero. A free induction attenuation signal is generated in the process of attenuation. The free induction attenuation signal can be sensed and received by a local receive coil as a magnetic resonance signal, and is transmitted to a receive chain module corresponding to the local receive coil via a cable. The receive chain module includes modules such as an amplifier, an analog-to-digital converter, and the like. Finally, a magnetic resonance image is reconstructed. Reference may be made to the related art for details. In addition, there is a decoupling circuit of a coil array structure for electromagnetic decoupling between the local receive coil and the transceiver coil in the process of radio-frequency transmission to avoid affecting the transmit field.

In some embodiments, as shown in FIG. 8, after a scanning protocol is set, a transmit link of a magnetic resonance system generates a digital pulse waveform according to a selected scanning sequence, and the digital pulse waveform is converted into an analog signal by a digital-to-analog (D/A) converter. The analog signal is amplified by a radio-frequency power amplifier and transmitted to a transceiver coil via a transmission cable, and drives the transceiver coil (which is, for example, configured into a transmit mode by a T/R switch, and orthogonally fed power by means of I and Q paths) to transmit a radio-frequency pulse. The radio-frequency coil is disposed in a scanning space defined by the transceiver coil. The radio-frequency coil and the transceiver coil generate electromagnetic coupling. Therefore, a current may be induced in the radio-frequency coil, that is, the radio-frequency pulse may be transferred from the transceiver coil to the radio-frequency coil by using the induced magnetic field. The radio-frequency pulse transferred to the radio-frequency coil generates a uniform magnetic field B1 that excites a subject to be examined, and excites the subject to be examined to generate resonance, so as to generate a transverse magnetization vector. After the transmission of the radio-frequency pulse is completed (after the magnetic field B1 is removed), the transverse magnetization vector attenuates in a spiral shape until it returns to zero. A free induction attenuation signal is generated in the process of attenuation. The free induction attenuation signal can be sensed and received by the radio-frequency coil as a magnetic resonance signal. Similarly, when the radio-frequency coil receives the magnetic resonance signal, a current may be induced in the transceiver coil, that is, the magnetic resonance signal may be transferred from the radio-frequency coil to the transceiver coil by using the induced magnetic field, transmitted to a receive link of the transceiver coil via a transmission cable connected to the transceiver coil, amplified by a pre-amplifier, demodulated, filtered, analog-to-digital converted, pre-processed, Fourier transformed, and so on, and finally reconstructed into a magnetic resonance image.

Since the radio-frequency coil is independent, it may transmit and receive radio-frequency signals on its own without being provided with a cable interface or connected to an examination table via a cable. Therefore, the magnetic resonance image can be reconstructed using only the receive link of the system connected to the transceiver coil without needing to provide DC power for switching the transmit/receive modes, provide the decoupling circuit in conventional coil array structures, or comparing, FIG. 8 with FIG. 7, provide an additional receive chain module (for example, a receive chain module corresponding to the conventional coil array, such as an amplifier, an analog-to-digital converter module, and the like). That is, radio-frequency signals are transmitted and received by means of the electromagnetic coupling between the transceiver coil and the radio-frequency coil in the absence of a cable and a cable interface. Thus, the wiring problem of the magnetic resonance system can be simplified, simplifying the circuit structure, improving reliability, reducing the failure rate, and reducing costs.

It is worth noting that FIG. 6 above merely schematically illustrates an embodiment of the present application, but the present application is not limited thereto. For example, the order of execution between operations may be appropriately adjusted. In addition, some other operations may be added, or some operations may be omitted. Those skilled in the art could make appropriate variations according to the above content, rather than being limited by the disclosure of FIG. 6 described above.

The above embodiments merely provide illustrative descriptions of the embodiments of the present application. However, the present application is not limited thereto, and appropriate variations may be made on the basis of the above embodiments. For example, each of the above embodiments may be used independently, or one or more among the above embodiments may be combined.

It is worth noting that only components or modules related to the present application have been described above, but the present application is not limited thereto. The receive/transmit link in FIG. 8 may also include other components or modules, and reference may be made to the related art for details of these components or modules.

The embodiments of the present application provide a magnetic resonance imaging system. The magnetic resonance imaging system includes at least a radio-frequency coil assembly. The radio-frequency coil assembly includes the transceiver coil and the radio-frequency coil described previously. The implementation of the transceiver coil and the radio-frequency coil is as described previously, and will not be described here again.

Figure 9:
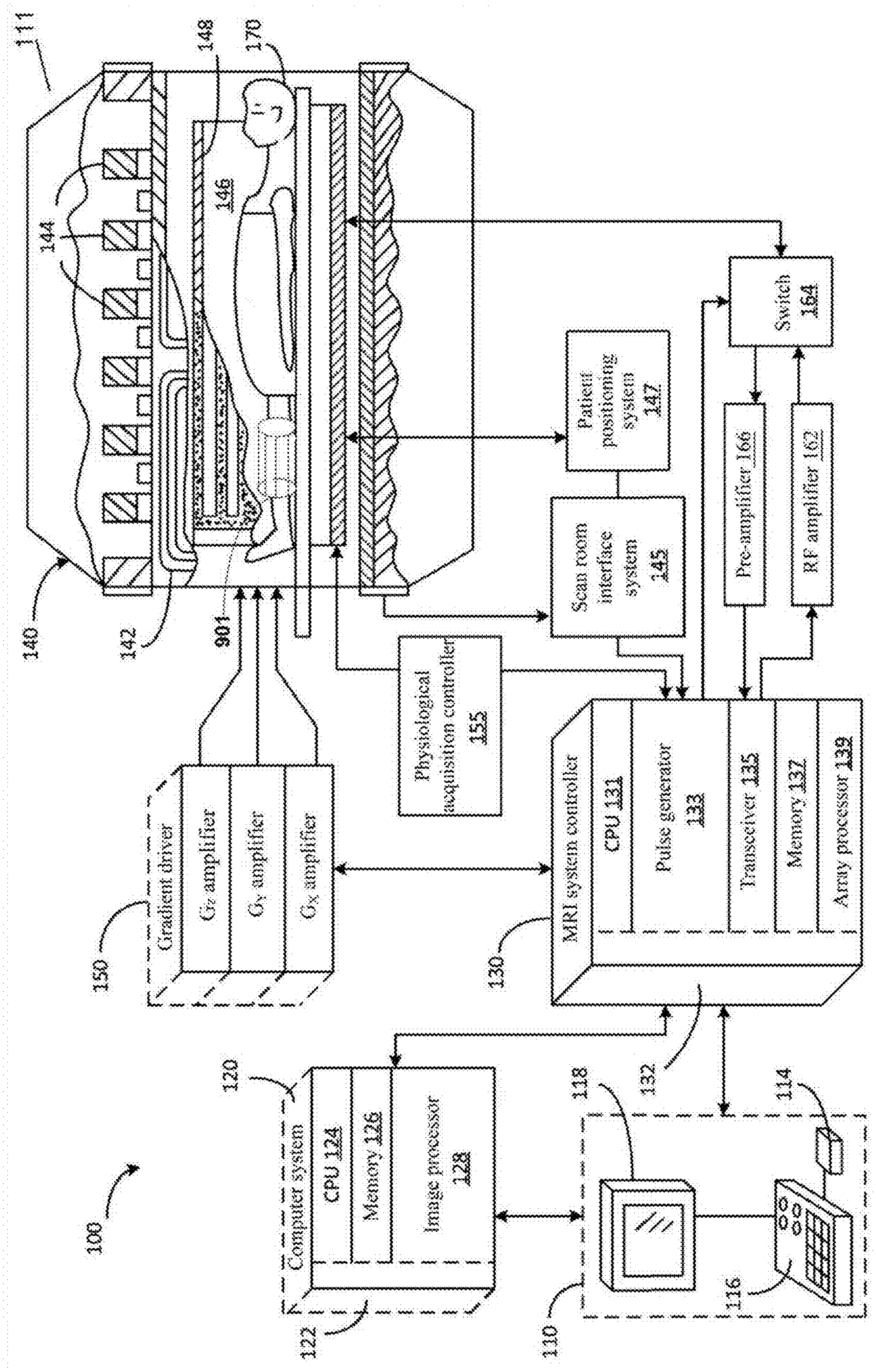
FIG. 9 is a schematic diagram of a magnetic resonance imaging system according to an embodiment of the present application.

FIG. 9 is a schematic diagram of a magnetic resonance imaging system according to an embodiment of the present application. As shown in FIG. 9, it is different from FIG. 1 in that the magnetic resonance imaging system further includes a radio-frequency coil 901 of the foregoing embodiments. The implementation of the radio-frequency coil 901 is as described previously, and will not be described here again.

Figure 10:
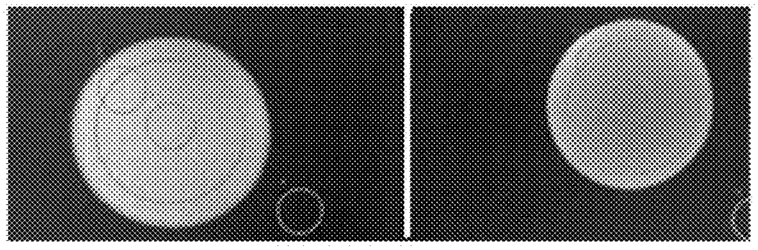
FIG. 10 is a schematic diagram of comparison between a reconstructed image obtained via a radio-frequency coil and a reconstructed image obtained via a conventional local coil.

FIG. 10 is a schematic diagram of comparison between a reconstructed image obtained via a radio-frequency coil and a reconstructed image obtained via a conventional local coil. As shown in FIG. 10, the left image is a reconstructed image obtained via the radio-frequency coil of the present application, and the right image is a reconstructed image obtained using a conventional local receive coil. The left reconstructed image has better uniformity and is at a position closer to the center, and the signal-to-noise ratio is also significantly improved compared with the conventional local receive coil, which is more favorable for clinical observation for examination that is more concerned with joint sites (typically closer to the center of the image). The radio-frequency transmit power (TG) is also further reduced.

Figure 11:
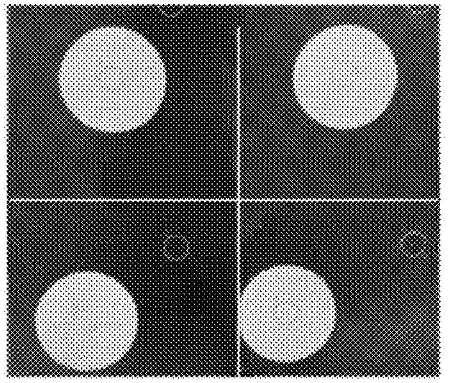
FIG. 11 is a schematic diagram of a reconstructed image obtained via a radio-frequency coil according to an embodiment of the present application.

FIG. 11 is a schematic diagram of a reconstructed image obtained via a radio-frequency coil. As shown in FIG. 11, the upper left image is an image when the center of the radio-frequency coil is aligned with the center of a scanned site, and the upper right, lower left, and lower right images are images when the center of the radio-frequency coil is shifted from the center of the scanned site by 20 mm, 50 mm, and 70 mm, respectively. Upon comparison, the image quality obtained when the radio-frequency coil is shifted from the center of the scanned site is approximately the same as that obtained when the radio-frequency coil is located at the center of the scanned site, and neither the signal-to-noise ratio nor the transmit power varies greatly along with shifting from the position of the center. That is, the radio-frequency coil of the present application has lower sensitivity to a change in position, further improving reliability.

The above apparatus and method of the present application can be implemented by hardware, or can be implemented by hardware in combination with software. The present application relates to the foregoing type of computer-readable program. When executed by a logic component, the program causes the logic component to implement the foregoing apparatus or a constituent component, or causes the logic component to implement various methods or steps as described above. The present application further relates to a storage medium for storing the above program, such as a hard disk, a magnetic disk, an optical disk, a DVD, a flash memory, etc.

The method/apparatus described with reference to the examples of the present application may be directly embodied as hardware, a software module executed by a processor, or a combination of the two. For example, one or more of the functional block diagrams and/or one or more combinations of the functional block diagrams as shown in the drawings may correspond to either software modules or hardware modules of a computer program flow. The foregoing software modules may respectively correspond to the steps shown in the figures. The foregoing hardware modules may be implemented, for example, by firming the foregoing software modules by using a field-programmable gate array (FPGA).

The software modules may be located in a RAM memory, a flash memory, a ROM memory, an EPROM memory, an EEPROM memory, a register, a hard disk, a removable disk, a CD-ROM, or any storage medium in other forms known in the art. The storage medium may be coupled to a processor, so that the processor can read information from the storage medium and can write information into the storage medium. Alternatively, the storage medium may be a constituent component of the processor. The processor and the storage medium may be located in an ASIC. The software module may be stored in a memory of a mobile terminal, and may also be stored in a memory card that can be inserted into a mobile terminal. For example, if a device (such as a mobile terminal) uses a large-capacity MEGA-SIM card or a large-capacity flash memory apparatus, then the software modules may be stored in the MEGA-SIM card or the large-capacity flash memory apparatus.

One or more of the functional blocks and/or one or more combinations of the functional blocks shown in the drawings may be implemented as a general-purpose processor, a digital signal processor (DSP), an application-specific integrated circuit (ASIC), a field-programmable gate array (FPGA) or other programmable logic devices, a discrete gate or transistor logic device, a discrete hardware assembly, or any appropriate combination thereof, which is used for implementing the functions described in the present application. The one or more functional blocks and/or the one or more combinations of the functional blocks shown in the drawings may also be implemented as a combination of computing equipment, such as a combination of a DSP and a microprocessor, a plurality of microprocessors, one or more microprocessors in communication combination with a DSP, or any other such configuration.

The present application is described above with reference to specific embodiments. However, it should be clear to those skilled in the art that the foregoing description is merely illustrative and is not intended to limit the scope of protection of the present application. Various variations and modifications may be made by those skilled in the art according to the principle of the present application, and said variations and modifications also fall within the scope of the present application.

The invention claimed is:

1. A radio-frequency signal processing method for a magnetic resonance imaging system, the method comprising:

receiving, via a radio-frequency coil, a radio-frequency pulse transmitted from a transceiver coil to generate a radio-frequency field that excites a subject to be examined; and sending, via the radio-frequency coil, a magnetic resonance signal received from the subject to be examined to the transceiver coil, wherein the radio-frequency coil and the transceiver coil are electromagnetically coupled, wherein the radio-frequency coil comprises a birdcage-like structure and is capable of being unfolded into a rectangular sheet-like structure, wherein the radio-frequency coil further comprises an electrical layer forming the birdcage-like structure, a first mechanical layer, and a second mechanical layer, and the electrical layer is arranged between the first mechanical layer and the second mechanical layer, and wherein a first connecting portion is disposed on the first mechanical layer on one side of the rectangular sheet-like structure, a second connecting portion is disposed on the second mechanical layer on the other side of the rectangular sheet-like structure and the first connecting portion and the second connecting portion are connected and fixed, so that the radio-frequency coil is changed from the rectangular sheet-like structure to a closed birdcage-like structure.

2. The method according to claim 1, wherein the radio-frequency coil receives the radio-frequency pulse from the transceiver coil and sends the magnetic resonance signal to the transceiver coil by means of the electromagnetic coupling between the transceiver coil and the radio-frequency coil.

3. The method according to claim 1, wherein the radio-frequency coil is disposed in a scanning space defined by the transceiver coil.

4. The method according to claim 1, wherein the radio-frequency coil is located between the transceiver coil and the subject to be examined, and the electromagnetic coupling is generated between the transceiver coil and the radio-frequency coil in a wireless non-contact manner.

5. The method according to claim 1, wherein the radio-frequency coil is not electrically connected to other structures in the magnetic resonance imaging system.

6. The method according to claim 1, wherein the transceiver coil comprises a body coil.

7. The method according to claim 1, wherein the radio-frequency coil comprises at least one of a head coil, a knee coil, an ankle joint coil, an abdomen coil, an elbow coil, a chest coil, a spine coil, a neck coil, and a shoulder coil.

8. The method according to claim 1, wherein the radio-frequency coil and the transceiver coil have the same electromagnetic structure.

9. The method according to claim 1, wherein the volume of the radio-frequency coil is smaller than the volume of the transceiver coil.

10. The method according to claim 1, wherein the first connecting portion and the second connecting portion are electrically connected to the electrical layer.

11. The method according to claim 1, wherein the first connecting portion and the second connecting portion are made of an electrically-conductive material.

12. The method according to claim 1, wherein a third connecting portion is further disposed on the first mechanical layer on one side of the rectangular sheet-like structure, a fourth connecting portion is further disposed on the second mechanical layer on the other side of the rectangular sheet-like structure, and the third connecting portion and the fourth connecting portion are connected and fixed, so that the radio-frequency coil is changed from the rectangular sheet-like structure to the closed birdcage-like structure.

13. The method according to claim 12, wherein the third connecting portion and the fourth connecting portion are made of an insulating material.

14. The method according to claim 1, wherein a curved arc-shaped protrusion is disposed on a surface of the first mechanical layer.

15. The method according to claim 1, wherein at least one groove is disposed on a surface of the first mechanical layer.

16. A radio-frequency coil, comprising:

a birdcage-like structure, wherein the radio-frequency coil is capable of being unfolded into a rectangular sheet-like structure;

an electrical layer forming the birdcage-like structure;

a first mechanical layer; and a second mechanical layer, wherein the electrical layer is arranged between the first mechanical layer and the second mechanical layer, wherein a first connecting portion is disposed on the first mechanical layer on one side of the rectangular sheet-like structure, a second connecting portion is disposed on the second mechanical layer on the other side of the rectangular sheet-like structure and the first connecting portion and the second connecting portion are connected and fixed, so that the radio-frequency coil is changed from the rectangular sheet-like structure to a closed birdcage-like structure, wherein the radio-frequency coil is configured to:

receive a radio-frequency pulse transmitted from a transceiver coil to generate a radio-frequency field that excites a subject to be examined; and send a magnetic resonance signal received from the subject to be examined to the transceiver coil, wherein the radio-frequency coil and the transceiver coil are electromagnetically coupled.

* * * * *